US008655611B2

(12) United States Patent
Archibald et al.

(10) Patent No.: US 8,655,611 B2
(45) Date of Patent: Feb. 18, 2014

(54) ESTABLISHING A POWER PROFILE FOR GENERATING ELECTRICAL RATINGS

(71) Applicant: International Business Machines Corporation, Armonk, NY (US)

(72) Inventors: Matthew R. Archibald, Morrisville, NC (US); Nickolas J. Gruendler, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/909,483

(22) Filed: Jun. 4, 2013

(65) Prior Publication Data
US 2013/0268220 A1    Oct. 10, 2013

Related U.S. Application Data

(63) Continuation of application No. 12/327,303, filed on Dec. 3, 2008.

(51) Int. Cl.
*G01R 21/00* (2006.01)
(52) U.S. Cl.
USPC .................................. 702/61; 702/57; 702/60
(58) Field of Classification Search
USPC ................................................ 702/54, 60–61
See application file for complete search history.

(56) References Cited

U.S. PATENT DOCUMENTS

| 6,854,099 | B2 | 2/2005 | Dewey, III et al. |
| 7,197,411 | B1 | 3/2007 | Gross et al. |
| 7,210,048 | B2 | 4/2007 | Bodas |
| 7,363,517 | B2 | 4/2008 | Bodas |
| 2002/0004912 | A1 | 1/2002 | Fung |
| 2003/0033547 | A1 | 2/2003 | Larson et al. |
| 2003/0126475 | A1 | 7/2003 | Bodas |
| 2006/0082222 | A1 | 4/2006 | Pincu et al. |
| 2008/0010521 | A1 | 1/2008 | Goodrum et al. |
| 2008/0028246 | A1 | 1/2008 | Witham |
| 2009/0070771 | A1 | 3/2009 | Yuyitung et al. |
| 2009/0228726 | A1 | 9/2009 | Malik et al. |
| 2010/0138174 | A1 | 6/2010 | Archibald et al. |

OTHER PUBLICATIONS

Kersting, W.H., et al., "Modeling and Analysis of Rural Electric Distribution Feeders," IEEE Transactions on Industry Applications, Jul./Aug. 1992, pp. 767-773, vol. 28, No. 4, Coll. of Eng., New Mexico State Univ., Las Cruces, N.M., USA DOI: 10.1109/28.148441.

Office Action, U.S. Appl. No. 12/327,303, mailed May 4, 2011.

(Continued)

*Primary Examiner* — Mischita Henson
(74) *Attorney, Agent, or Firm* — Edward J. Lenart; Katherine S. Brown; Biggers Kennedy Lenart Spraggins LLP

(57) ABSTRACT

Establishing a power profile of power consuming components of computer system configurations for generating electrical ratings, beginning with a default, limited configuration of a computer system and continuing for a number of configurations of the computer system, each configuration including additional power consuming components not included in a previous configuration, where establishing a power profile includes: measuring, for a present configuration, power consumption of the computer system; calculating, in dependence upon the measured power consumption for the present configuration, an estimated power rating for the one or more additional power consuming components; and recording, in a power profile, estimated power ratings for the additional power consuming components, where the number of configurations of the computer system for which power consumption is measured is less than the number of possible configurations of the computer system.

7 Claims, 6 Drawing Sheets

(56) References Cited

OTHER PUBLICATIONS

Final Office Action, U.S. Appl. No. 12/327,303, mailed Oct. 26, 2011.
Office Action, U.S. Appl. No. 12/327,303, mailed May 16, 2012.
Office Action, U.S. Appl. No. 12/327,303, mailed Oct. 17, 2012.
Notice of Allowance, U.S. Appl. No. 12/327,303, mailed Apr. 22, 2013.

ESTABLISHING A POWER PROFILE FOR GENERATING ELECTRICAL RATINGS

CROSS-REFERENCE TO RELATED APPLICATION

This application is a continuation application of and claims priority from U.S. patent application Ser. No. 12/327,303, filed on Dec. 3, 2008.

BACKGROUND OF THE INVENTION

1. Field of the Invention

The field of the invention is data processing, or, more specifically, methods, apparatus, and products for establishing a power profile of power consuming components of computer system configurations for generating electrical ratings.

2. Description Of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago. Computer systems today are extremely configurable such that, when purchasing a computer system, a user may select among many components, those components to include in the user's computer system. A user may specify, for example, the size, disk speed, and quantity of hard drives, the clock speed, number of cores, and quantity of computer processors, the clock speed, memory size, and quantity of Random Access Memory ('RAM') modules, and so on. Each different configuration of the computer system may consume a different amount of power during operation. In large data centers that include many hundreds or thousands of computer systems, servers, and other electrical equipment, power delivery through circuit breakers and similar power delivery equipment is provisioned to the computer systems in dependence upon electrical ratings of the computer system that typically only specify a permissible AC input voltage range and a maximum current draw for a computer system, such as electrical ratings provided by UL ('Underwriters Laboratories'). Electrical ratings are typically listed on a label affixed to the computer system and are derived from a highly conservative estimate of the highest power consuming configuration of the computer system, sometimes even rounded up to the nearest Ampere or Watt. When computer systems are configured with fewer components or more power efficient components, the electrical rating listed on the label of the computer system may be inaccurate, typically an overestimate of maximum possible current draw of the computer. Inaccurate electrical ratings of computer systems may cause inefficient provisioning of power delivery—too few server enclosures per circuit breaker and the like.

SUMMARY OF THE INVENTION

Methods, apparatus, and products for establishing a power profile of power consuming components of computer system configurations for generating electrical ratings are disclosed that include: beginning with a default, limited configuration of a computer system and continuing for a number of configurations of the computer system, each configuration including additional power consuming components not included in a previous configuration: measuring, by a system technician for a present configuration, power consumption of the computer system; calculating, by a power profiling module in dependence upon the measured power consumption for the present configuration, an estimated power rating for the one or more additional power consuming components not included in the previous configuration; and recording, by the power profiling module in a power profile, estimated power ratings for the one or more additional power consuming components not included in the previous configuration, where the number of configurations of the computer system for which power consumption is measured is less than the number of possible configurations of the computer system.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
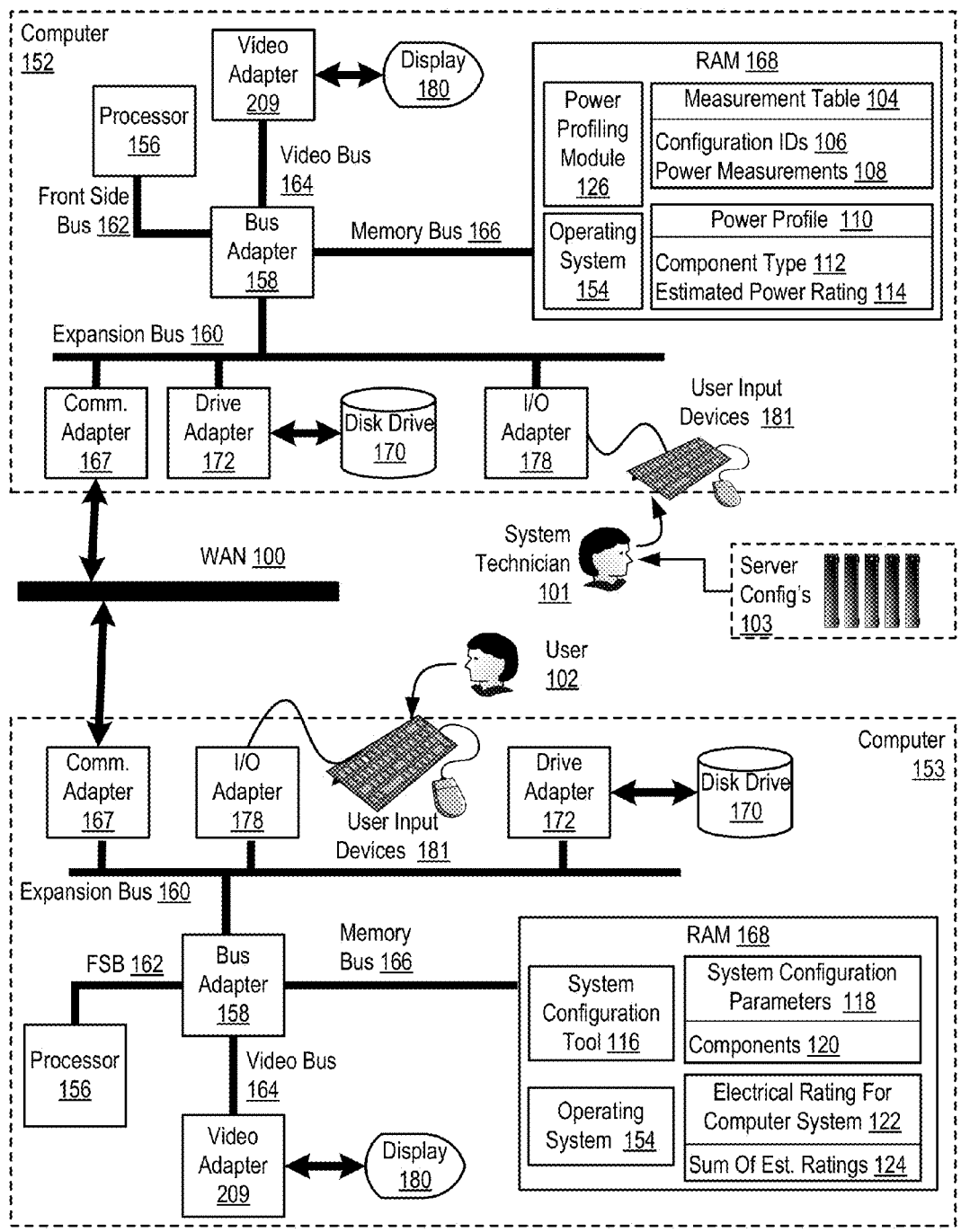
FIG. 1 sets forth a network diagram of an exemplary system for establishing a power profile of power consuming components of computer system configurations for generating electrical ratings according to embodiments of the present invention.

Exemplary methods, apparatus, and products for establishing a power profile of power consuming components of computer system configurations for generating electrical ratings in accordance with the present invention are described with reference to the accompanying drawings, beginning with FIG. 1. FIG. 1 sets forth a network diagram of an exemplary system for establishing a power profile of power consuming components of computer system configurations for generating electrical ratings according to embodiments of the present invention. The system of FIG. 1 includes two computers (152,153) each of which in turn includes at least one computer processor (156) or 'CPU' as well as random access memory (168) ('RAM') which is connected through a high speed memory bus (166) and bus adapter (158) to processor (156) and to other components of the computer (152, 153). The computers of FIG. 1 are connected to on another for data communications through a wide area network ('WAN') (100).

Stored in RAM (168) of the computer (152) is a power profiling module (126), a module of computer program instructions that operates generally for establishing a power profile of power consuming components of computer system configurations for generating electrical ratings according to embodiments of the present invention. A power consuming component is a component of a computer system that consumes an appreciable amount of power during operation of the computer system. Examples of power consuming components include hard drives, memory modules, processors, input/output ('I/O') adapters, bus adapters, optical drives, and so on as will occur to readers of skill in the art. A power profile (110) as the term is used in this specification is any data structure or collection of data structures that includes information specifying estimated power ratings for power consuming components of computer systems. Examples of data structures that may form a power profile (110) include tables, lists, linked lists, databases, spreadsheets, and so on as will occur to readers of skill in the art.

The system technician (101) and the power profiling module (126) of FIG. 1 may establish a power profile of power consuming components of computer system configurations for generating electrical ratings according to embodiments of the present invention by: beginning with a default, limited configuration of a computer system and continuing for a number of configurations of the computer system, each configuration including additional power consuming components not included in a previous configuration: measuring, by a system technician (101) for a present configuration, power consumption of the computer system; calculating, by the power profiling module (126) in dependence upon the measured power consumption for the present configuration, an estimated power rating (114) for the one or more additional power consuming components not included in the previous configuration; and recording (306), by the power profiling module (126) in a power profile (110), estimated power ratings (114) for the one or more additional power consuming components not included in the previous configuration.

A system technician (101) is a human user that measures power consumption of computer systems. In the example of FIG. 1, the system technician (101) measures power consumption of servers, one example type of computer system, for a number of a server configurations (103). A 'configuration' of a computer system is a specification of one or more power consuming components to be installed in a computer system. Consider the server configuration (103) as an example of computer system configurations. Each server configuration may be specified as a default, or 'base,' model with the addition of one or more components such as hard drives, memory modules, optical drives, bus adapters, and so on.

The example system technician (101) of FIG. 1 first measures the power consumption of a default, limited server configuration and then continues with other server configurations, where each subsequent server configuration includes additional components. That is, each subsequent configuration includes at least one component not included in a previous configuration. Readers of skill in the art will recognize, however, that a subsequent configuration need not have a greater number of components than a previous configuration to include an additional component. 'Additional' components as the term is used in this specification may refer to components, having the same type but with characteristics, such as capacity, operating speed, memory size, and so on. Each subsequent configuration may actually include the same number of components, where one component is effectively replaced by another component, of the same type, with differing operating characteristics. For example, consider a base configuration of a server having a 250 Gigabyte ('GB') hard drive, and a subsequent configuration, without the 250 GB hard drive, but having as its one and only 'additional component,' a 500 GB hard drive instead. Consider as other examples of 'additional components' the following order of configurations for which the system technician measures power consumption of the computer system: a first, default configuration including only a slow, single-core CPU, onboard ROM with a lightweight operating system, and no other components—no RAM, no hard drive, no I/O adapters, no optical drives—a second configuration similar to the first, but with a hard drive; a third configuration including a hard drive and a single dual in-line memory module ('DIMM'); a fourth configuration including a hard drive, single DIMM, and optical drive, and so on. In the example of FIG. 1, the number of configurations of the computer system for which power consumption is measured by the system technician is less than the number of possible configurations of the computer system. That is, a computer system may be configured with an almost infinite number of combinations of components due to many variables in the combination such as, for example, variable components within the computer system, variable numbers of the same component, variable types or brands of the same component, variable sizes or speeds of the same component, and so on. As such, measuring power consumption of each possible configuration may be prohibitively time consuming, expensive, and inefficient.

An estimated power rating (114) for the one or more additional power consuming components not included in the previous configuration is a value representing an estimation of typical power consumption by the additional power consuming component. An estimated power rating for a 1 Gigabyte ('GB') DIMM, for example, may be 10 Watts. The term 'estimated' is used here to describe the power rating because, as mentioned above, power consumption of the computer system is not measured for every possible configuration of the computer system and in some embodiments the actual power consumption of a power consuming component may vary from the estimated power rating for various reasons. One example reason which actual power consumption of a power consuming component may vary from estimated power ratings is that components from different manufacturers may consume different amount of power during operation. Consider as an example, a 1 GB DIMM manufactured by a first manufacturer and a 1 GB DIMM manufactured by a second manufacturer, where the DIMM manufactured by the first manufacturer generally consumes 25 Watts and the DIMM manufactured by the second manufacturer generally consumes 12 Watts. As power consumption for only one or two 1 GB DIMMs of different manufacturers is actually measured in generating the power profile, power consumption of 1 GB DIMMs from other manufacturers may not exactly match the estimated power rating for the 1 GB DIMM in the power profile (110).

Another example reason which actual power consumption of a power consuming component may vary from estimated power ratings is that multiple components of the same type in a computer system may individually consume a different amount of power consumption than one component in a computer system. Consider as an example, a computer system having four, 1 GB DIMMS. The fourth DIMM in such a computer system may consume less power than any other DIMM because it is accessed less often than the first three DIMMs.

Another reason which actual power consumption of a power consuming component may vary from estimated power ratings is that in some configurations of a computer system, one component may consume less power than it would otherwise consume due to the operation of another, different component in the computer system. Consider as an example, a computer system having 4 GB of RAM and a hard drive. The hard drive may consume less power than it would with only 1 GB of RAM in the computer system because the operating system pages out to the hard drive less with 4 GB of RAM than with 1 GB of RAM, meaning the hard drive operates less with 4 GB than with 1 GB of RAM.

Stored in RAM (168) of the computer (153) is a system configuration tool (126), a module of computer program instructions that operates generally for establishing a power profile of power consuming components of computer system configurations for generating electrical ratings according to embodiments of the present invention by generating electrical ratings (122) for one or more computer systems in dependence upon the power profile (110). An electrical rating (122) for a computer system is a specification of one or more power consumption characteristics of the computer system including, for example, an maximum Alternating Current ('AC') current draw for the computer system as presently configured, also referred to her as an 'as-configured' electrical rating. An as-configured electrical rating differs from electrical ratings of the prior art, which typically only specify a permissible AC input voltage range and a maximum current draw for a computer system, where the maximum current draw is derived from the most power consuming configuration possible and typically rounded up to the nearest Ampere. A prior art electrical rating for a computer system of a less power consuming configuration, therefore, may specify a maximum current draw much greater than any current draw possible by that computer system. Such electrical ratings in data centers are typically used to provision power, through circuit breakers and the like, within the data center, for a particular set of server enclosures, or for one server enclosure. Using the prior art electrical ratings to provision power among servers in data center may result in 'over-provisioning' of power, limiting the number of servers, enclosures, and other equipment which may be connected to a particular set of circuit breakers.

The system configuration tool (116) may generate electrical ratings by receiving, from a user (102), system configuration parameters (118) defining a configuration of a computer system. A 'user' that provides system configuration parameters to the system configuration tool (116) may be a customer, or purchaser, of a computer system, here a server (103), or may be a distributor or vendor of a computer system that configures the computer system prior to shipping the system to a customer. The system configuration parameters (118), in the example of FIG. 1, are values stored in a data structure that specify one or more power consuming components (120) of the computer system. The values may specify a component type, a memory size of a component, a clock speed of the component, a bus speed of the component, a quantity of the component in the computer system, and so on as will occur to readers of skill in the art. The system configuration tool (116) may also sum, in dependence upon the power profile (110) of power consuming components, estimated power ratings (114) of the power consuming components of the computer system configured in accordance with the system configuration parameters (118). The system configuration tool (116) may then provide, to the user (102), as the electrical rating (122) for the computer system configured in accordance with the system configuration parameters (118), the sum (124) of estimated power ratings of the power consuming components.

As shown here the system configuration tool (116) is an application program operating on a user's (102) computer (153), separate and distinct from the computer (152) on which the power profile module (126) executes. Readers of skill in the art will recognize that such separation of the system configuration tool (116) and power profiling module (126) is for explanation only, not limitation. In fact, the system configuration tool (116) may implemented as a web service, a Java servlet, or the like, served to Internet users, such as the user (102) of FIG. 1, by the same computer (152) executing the power profiling module (126). The system configuration tool (116) may also be implemented as web service, Java servlet, or the like, provided to Internet users, on a standalone web server, a computer other than the Internet the user's (102) computer (153) or the computer (152) on which the power profiling module (126) is executing. When hosted on a computer other than the user's (102) computer (153), the system configuration tool (116) may be a software component of a computer system sales application, a blade server sales application, for example, that accepts user specifications of computer systems, and generates a sales order to be filled by a vendor, distributor, manufacturer, or the like.

Also stored in RAM (168) of each computer (152, 153) is an operating system (154). Operating systems useful for establishing a power profile of power consuming components of computer system configurations for generating electrical ratings according to embodiments of the present invention include UNIX™, Linux™, Microsoft XP™, AIX™, IBM's i5/OS™, and others as will occur to those of skill in the art. The operating system (154), power profiling module (126), system configuration tool (126), measurement table (104), power profile (110), system configuration parameters (118), and electrical rating (122) in the example of FIG. 1 are shown in RAM (168), but many components of such software typically are stored in non-volatile memory also, such as, for example, on a disk drive (170).

Each computer (152, 153) of FIG. 1 includes a disk drive adapter (172) coupled through expansion bus (160) and bus adapter (158) to processor (156) and other components of the computer (152, 153). Disk drive adapter (172) connects non-volatile data storage to the computer (152, 153) in the form of disk drive (170). Disk drive adapters useful in computers establishing a power profile of power consuming components of computer system configurations for generating electrical ratings according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

Each example computers (152, 153) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. Each example computer (152, 153) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

Each exemplary computer (152, 153) of FIG. 1 includes a communications adapter (167) for data communications with other computers (152, 153) and for data communications with a data communications network (100). Such data communications may be carried out serially through RS-232 connections, through external buses such as a Universal Serial Bus ('USB'), through data communications data communications networks such as IP data communications networks, and in other ways as will occur to those of skill in the art. Communications adapters implement the hardware level of data communications through which one computer sends data communications to another computer, directly or through a data communications network. Examples of communications adapters useful for web search among rich media objects according to embodiments of the present invention include modems for wired dial-up communications, Ethernet (IEEE 802.3) adapters for wired data communications network communications, and 802.11 adapters for wireless data communications network communications.

The arrangement of computers (152, 153), system technicians (101), server configurations (103), users (102), networks (100), and other devices making up the exemplary system illustrated in FIG. 1 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Figure 2:
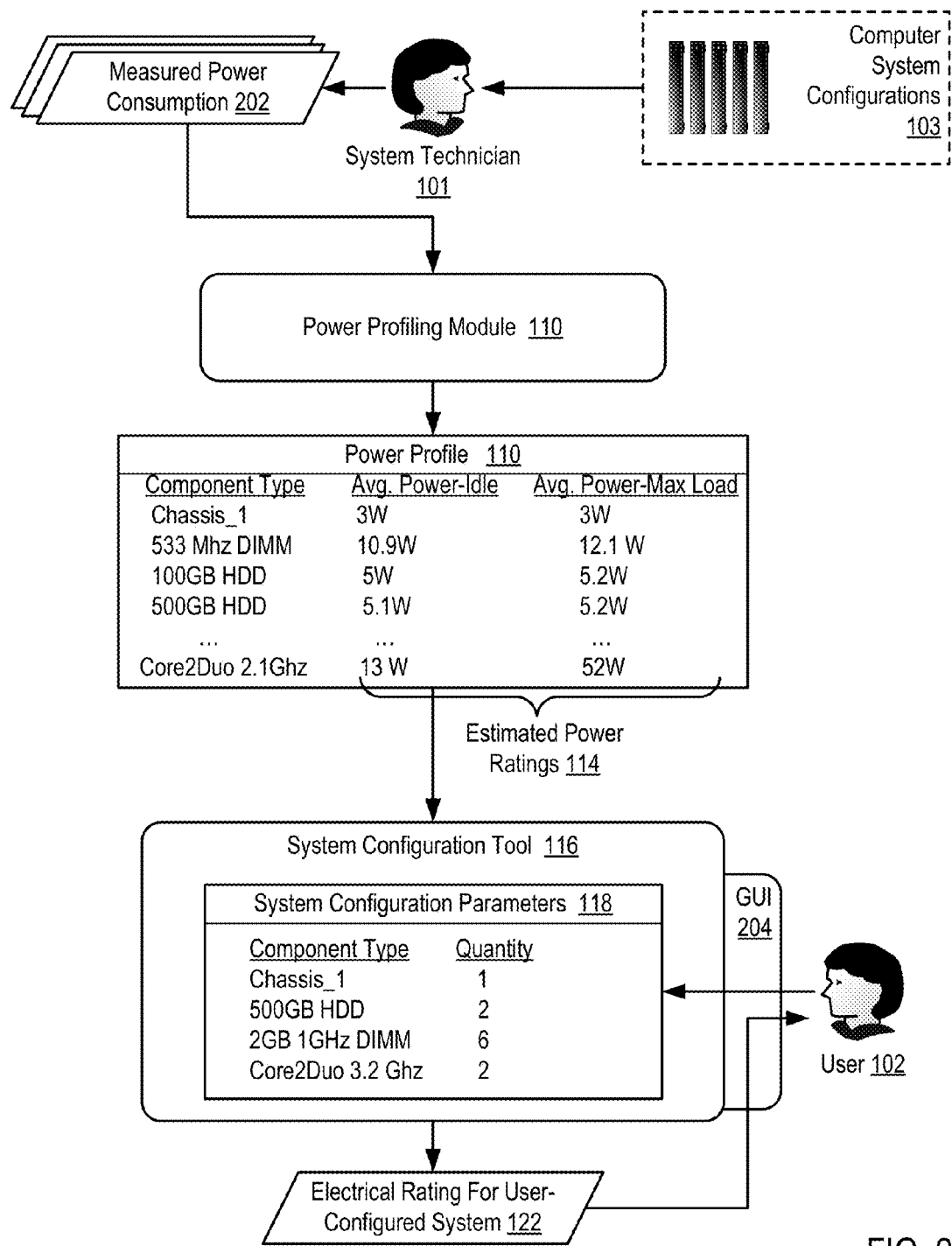
FIG. 2 sets forth a functional block diagram of an exemplary system for establishing a power profile of power consuming components of computer system configurations for generating electrical ratings according to embodiments of the present invention.

For further explanation, FIG. 2 sets forth a functional block diagram of an exemplary system for establishing a power profile of power consuming components of computer system configurations for generating electrical ratings according to embodiments of the present invention. The example system of FIG. 1 includes a system technician (101) that, beginning with a default, limited configuration (103) of a computer system and continuing for a number of configurations of the computer system with each configuration including additional power consuming components not included in a previous configuration: measures, for a present configuration, power consumption (202) of the computer system. As mentioned above, the number of configurations of the computer system for which power consumption is measured by the system technician (101) is less than the number of possible configurations of the computer system.

The example system of FIG. 2 also includes a power profiling module (110) that calculates, in dependence upon the measured power consumption (202) for the present configuration, an estimated power rating (114) for the one or more additional power consuming components not included in the previous configuration and records, in a power profile (110), estimated power ratings (114) for the one or more additional power consuming components not included in the previous configuration. In the example of FIG. 2 the power profile (110) is implemented as a table having three columns, one specifying a component type such as a hard disk drive ('HDD'), CPU, or DIMM, one column specifying an average power consumption of the component when the computer system is idle, and one column specifying an average power consumption of the component when the computer system is operating under a maximum load. That is, the system technician, in measuring power consumption of the computer system in its present configuration may measure power consumption twice, once when the computer system is idle and once when the computer system is operating under a maximum load. The computer system may be considered idle after loading the operating system but before loading user-level applications. The computer system may be operating under a maximum load when the system technician (101) starts an application program on the computer system where the application program includes computer program instructions which cause the computer to operate under the maximum load.

The example system of FIG. 2 also includes a system configuration tool (116) that provides to a user (102), a graphical user interface ('GUI') (204) through which the system configuration tool (116) receives system configuration parameters (118) defining a configuration of a computer system. The example system configuration parameters (118) of FIG. 2 specify one or more power consuming components of the computer system by component type and quantity.

The example system configuration tool (116) of FIG. 2 also sums, in dependence upon the power profile (110) of power consuming components, estimated power ratings (114) of the power consuming components of the computer system configured in accordance with the system configuration parameters and provides, to the user (102) as the electrical rating (122) user-configured computer system, the sum (124) of estimated power ratings of the power consuming components. For the example system configuration parameters (118) of FIG. 2 that specify for a computer system a particular chassis type, two 500 GB hard drives, six 2 GB, 1 gigahertz ('GHz') DIMMs, and two, 3.2 GHz Intel Core 2 Duo CPUs, the electrical rating for the user-configured computer system may include as a maximum power rating, 162.4 Watts, and as a minimum power rating, 81.4 Watts.

Figure 3:
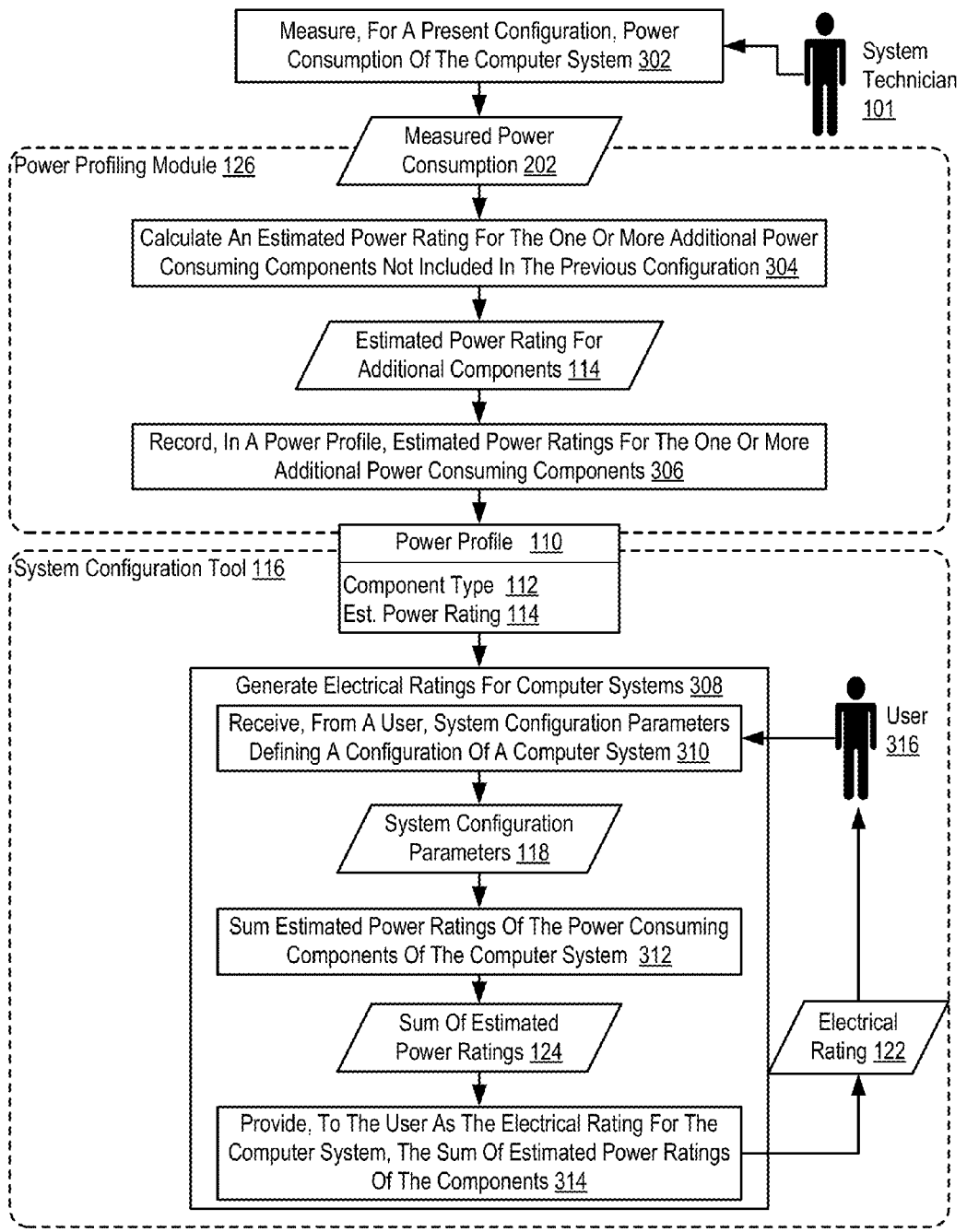
FIG. 3 sets forth a flow chart illustrating an exemplary method for establishing a power profile of power consuming components of computer system configurations for generating electrical ratings according to embodiments of the present invention.

For further explanation, FIG. 3 sets forth a flow chart illustrating an exemplary method for establishing a power profile of power consuming components of computer system configurations for generating electrical ratings according to embodiments of the present invention. The portion of the method of FIG. 3 carried out by the system technician (101) and the power profiling module (126) begins with a default, limited configuration of a computer system and continues for a number of configurations of a computer system, where each configuration includes additional power consuming components not included in a previous configuration. In the method of FIG. 3, the number of configurations of the computer system for which power consumption is measured is less than the number of possible configurations of the computer system.

The method of FIG. 3 includes measuring (302), by a system technician (101) for a present configuration, power consumption (202) of the computer system. Measuring (302), by a system technician (101) for a present configuration, power consumption (202) of the computer system may include calculating, with a current sensing circuit, current delivered by a power supply to the computer system during operation and providing the calculated current to the power profiling module (126) by recording the calculated current in a table of spreadsheet, in a record of a database, or in other ways as will occur to readers of skill in the art.

The method of FIG. 3 also includes calculating (304), by a power profiling module (126) in dependence upon the measured power consumption (202) for the present configuration, an estimated power rating (114) for the one or more additional power consuming components not included in the previous configuration. Calculating (304) an estimated power rating (114) for the additional components of the present configuration may be carried out by calculating the difference of the measured power consumption (202) of the present configuration of the computer system and the measured power consumption of the previous configuration of the computer system. Readers of skill in the art will recognize, that the difference in measured power consumption between the present and previous configuration represents the power consumption of the one or more additional components included in the present configuration but not included in the previous configuration.

The method of FIG. 3 also includes recording (306), by the power profiling module (126) in a power profile (110), estimated power ratings (114) for the one or more additional power consuming components not included in the previous configuration. Recording (306), by the power profiling module (126) in a power profile (110), estimated power ratings (114) may be carried out by storing, in a data structure, such as a table, for example, an association of a component type (112) of the additional component, and the calculated, estimated power rating (114) for the additional component. As mentioned above the power profile (110) may be implemented as any type of data structure such as a table, database, spreadsheet, list, and so on. In one embodiment of the present invention, for example, the power profiling module (126) and power profile (110) are software components and data structures of a spreadsheet application. Such a spreadsheet application may be configured to store in measurement fields of a spreadsheet data structure, power consumption measurements (202) of a present configuration entered into by the system technician (101). Other fields of the spreadsheet data structure may be configured to store the result of functions performed with the values stored in such measurement fields, where the functions calculate the difference between the power consumption measurements of various configurations of the computer system, the present configuration and a previous configuration. In such a spreadsheet-based embodiment, calculating and recording the estimated power rating may be carried out, responsive to the system technician entering the power measurements of a present configuration in a measurement field, by calculating the difference between the power consumption measurements of the present configuration and those of a previous configuration and storing the results in a field of the spreadsheet. In other alternative embodiments, the profiling module may be implemented as a software component that presents a GUI to a system technician, receives measured power consumption (202) data from the system technician, calculates the estimated power ratings from the power consumption measurements of present and previous configurations, and stores the calculated estimated power ratings in a separate data structure, the power profile, such as a table, list, and so on.

The method of FIG. 3 also includes generating (308), by a system configuration tool (116), electrical ratings (122) for one or more computer systems. In the method of FIG. 3 generating (308), by a system configuration tool (116), electrical ratings (122) for one or more computer systems includes: receiving (310), from a user (316), system configuration parameters (118) defining a configuration of a computer system where the system configuration parameters specify one or more power consuming components of the computer system; summing (312), in dependence upon the power profile (110) of power consuming components, estimated power ratings (114) of the power consuming components of the computer system configured in accordance with the system configuration parameters; and providing (314), to the user (316) as the electrical rating (122) for the computer system configured in accordance with the system configuration parameters, the sum (124) of estimated power ratings of the power consuming components.

The example system configuration tool (116) of FIG. 3 may receive (310), from a user (316), system configuration parameters (118) by receiving user input through a graphical user interface ('GUI') presented by the system configuration tool (116) to the user (316). The example system configuration tool (116) of FIG. 3 may sum (312) estimated power ratings (114) of the power consuming components of the computer system configured in accordance with the system configuration parameters by identifying from the system configuration parameters (118) a quantity of each power consuming component, calculating for each type of power consuming component the total estimated power rating for all power consuming components the same type, and summing all of the total estimated power ratings. The example system configuration tool (116) of FIG. 3 may providing (314), to the user (316) as the electrical rating (122) for the computer system configured in accordance with the system configuration parameters, the sum (124) of estimated power ratings of the power consuming components in various ways including for example, as a value through a GUI, printing an adhesive label for adhering to the computer system, and so on as may occur to readers of skill in the art.

Figure 4:
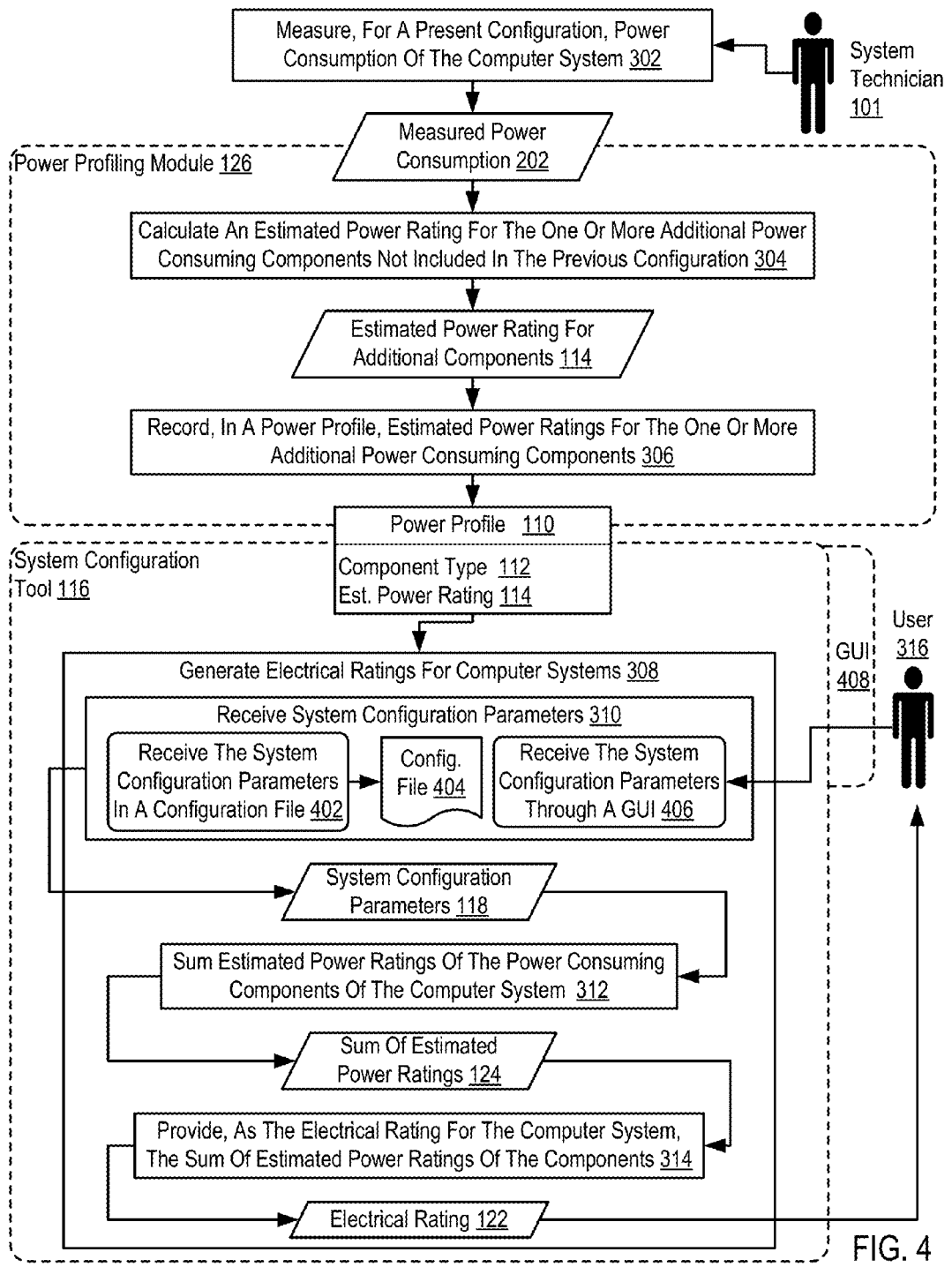
FIG. 4 sets forth a flow chart illustrating a further exemplary method for establishing a power profile of power consuming components of computer system configurations for generating electrical ratings according to embodiments of the present invention.

For further explanation, FIG. 4 sets forth a flow chart illustrating a further exemplary method for establishing a power profile of power consuming components of computer system configurations for generating electrical ratings according to embodiments of the present invention. The portion of the method of FIG. 4 carried out by the system technician (101) and the power profiling module, like the method of FIG. 3, begins with a default, limited configuration of a computer system and continues for a number of configurations of a computer system, where each configuration includes additional power consuming components not included in a previous configuration. Also like the method of FIG. 3, the number of configurations of the computer system for which power consumption is measured in the example of FIG. 4 is less than the number of possible configurations of the computer system.

The method of FIG. 4 is also similar to the method of FIG. 3 in that the method of Figure includes: measuring (302), for a present configuration, power consumption (202) of the computer system; calculating (304) an estimated power rating (114) for the additional power consuming components; recording (306) the estimated power ratings (114); and generating (308) electrical ratings (122) for one or more computer systems, including: receiving (310) system configuration parameters (118) defining a configuration of a computer system, summing (312) estimated power ratings (114) of the power consuming components of the computer system, and providing (314), as the electrical rating (122) for the computer system, the sum (124).

The method of FIG. 4 differs from the method of FIG. 3, however, in that in the method of FIG. 4 receiving (310), from a user (316), system configuration parameters (118) defining a configuration of a computer system may be carried out in various ways. One way in which the system configuration tool (116) may receive the system configuration parameters (116) includes receiving (404) the system configuration parameters (118) in a configuration file (404). A configuration file (404) includes at least one, and possibly many more, configuration definitions. That is, one configuration file may specify many different configurations of computer systems. Another way in which the system configuration tool (116) may receive the system configuration parameters (116) includes receiving (406) the system configuration parameters (118) through a graphical user interface ('GUI') (408) provided to the user by the system configuration tool (116).

Figure 5:
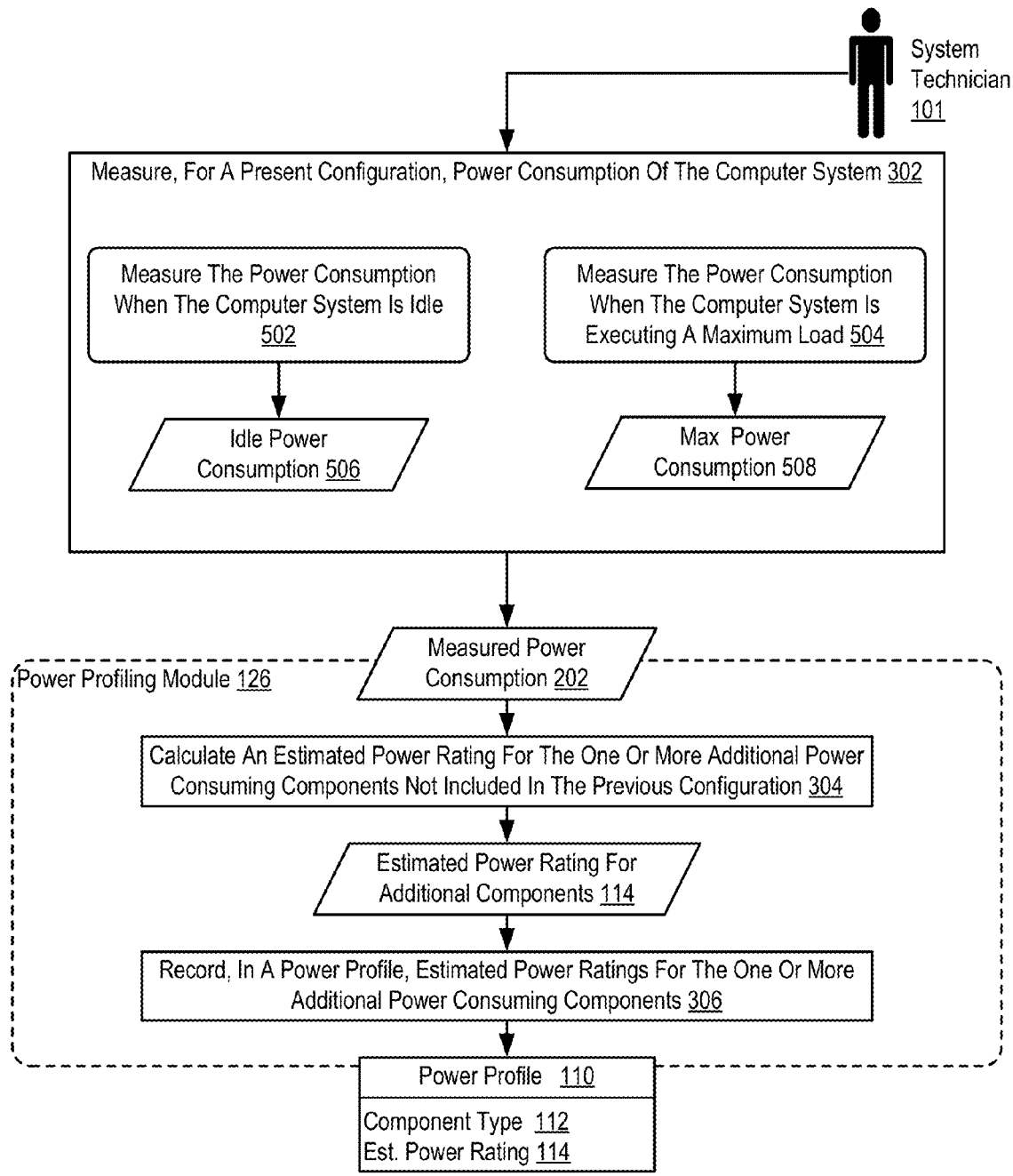
FIG. 5 sets forth a flow chart illustrating a further exemplary method for establishing a power profile of power consuming components of computer system configurations for generating electrical ratings according to embodiments of the present invention.

For further explanation, FIG. 5 sets forth a flow chart illustrating a further exemplary method for establishing a power profile of power consuming components of computer system configurations for generating electrical ratings according to embodiments of the present invention. The portion of the method of FIG. 5 carried out by the system technician (101) and the power profiling module (126), like the method of FIG. 3, begins with a default, limited configuration of a computer system and continues for a number of configurations of a computer system, where each configuration includes additional power consuming components not included in a previous configuration. Also like the method of FIG. 3, the number of configurations of the computer system for which power consumption is measured in the example of FIG. 5 is less than the number of possible configurations of the computer system.

The method of FIG. 5 is also similar to the method of FIG. 3 in that the method of Figure includes: measuring (302), for a present configuration, power consumption (202) of the computer system; calculating (304) an estimated power rating (114) for the additional power consuming components; and recording (306) the estimated power ratings (114). The method of FIG. 5 differs from the method of FIG. 3, however, in that in the method of FIG. 5, measuring (302), by a system technician (101) for a present configuration, power consumption (202) of the computer system includes measuring (502) the power consumption (506) when the computer system is idle and measuring (504) the power consumption (508) when the computer system is executing a maximum load.

Figure 6:
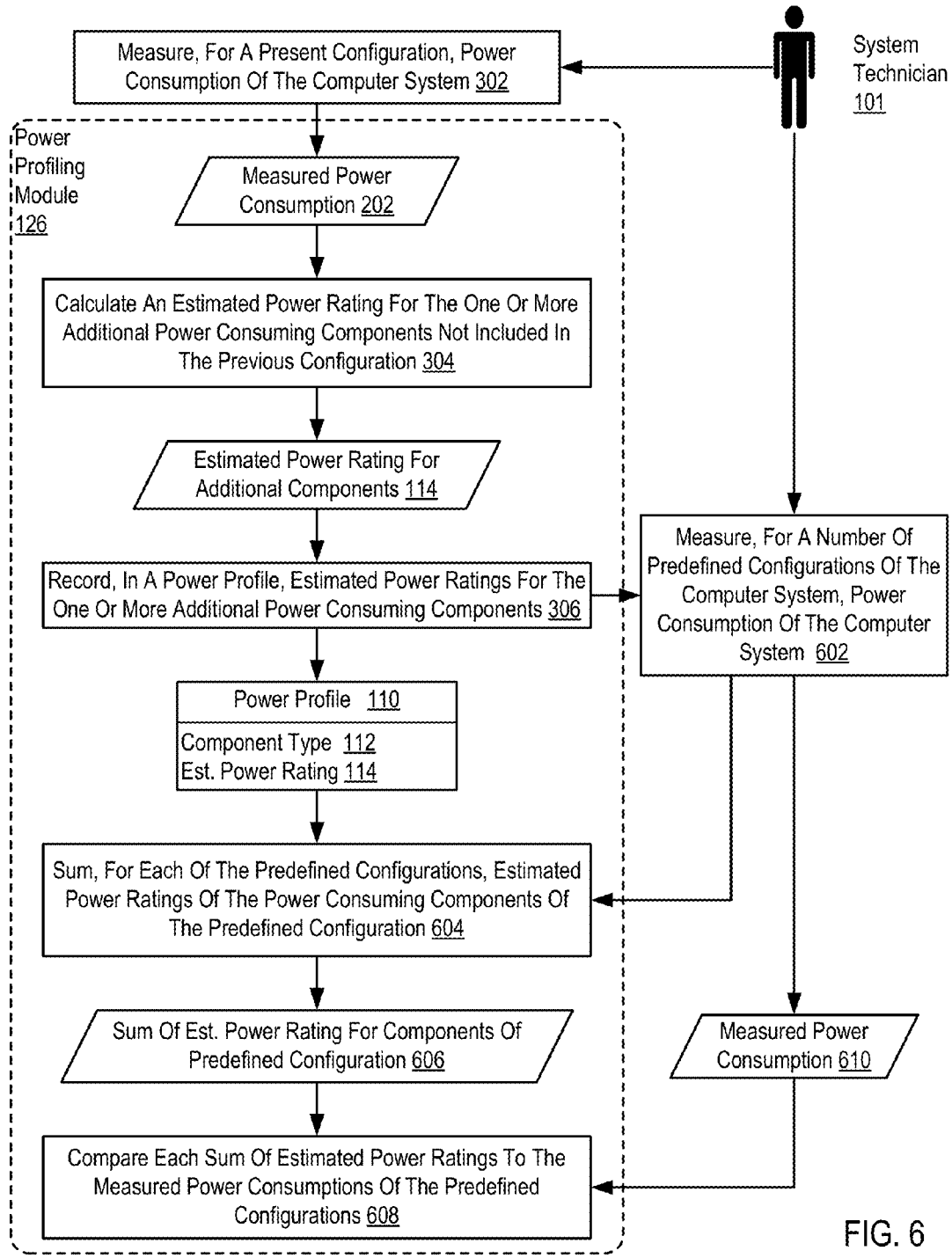
FIG. 6 sets forth a flow chart illustrating a further exemplary method for establishing a power profile of power consuming components of computer system configurations for generating electrical ratings according to embodiments of the present invention.

For further explanation, FIG. 6 sets forth a flow chart illustrating a further exemplary method for establishing a power profile of power consuming components of computer system configurations for generating electrical ratings according to embodiments of the present invention. The portion of the method of FIG. 6 carried out by the system technician (101) and the power profiling module (126), like the method of FIG. 3, begins with a default, limited configuration of a computer system and continues for a number of configurations of a computer system, where each configuration includes additional power consuming components not included in a previous configuration. Also like the method of FIG. 3, the number of configurations of the computer system for which power consumption is measured in the example of FIG. 6 is less than the number of possible configurations of the computer system.

The method of FIG. 6 differs from the method of FIG. 3, however, in that the method of FIG. 6 includes measuring (602), by the system technician (101) for a number of predefined configurations of the computer system, power consumption of the computer system with each predefined configuration including one or more power consuming components. A predefined configuration is a configuration of a computer system defined by a system technician (101) which is used to determine the accuracy of previously calculated estimated power ratings for components.

The method of FIG. 6 also includes summing (604), by the power profiling module (126) for each of the predefined configurations, estimated power ratings (114) of the power consuming components of the predefined configuration, and comparing (608), by the power profiling module (126), each sum (606) of estimated power ratings to the measured power consumptions (610) of the predefined configurations. That is, in the method of FIG. 6, the power profiling module sums the previously calculated and stored estimated power ratings of components of the predefined configuration. Then the power profiling module compares the sum to the measured power consumption to determine the accuracy of the estimated power ratings (114). If the comparison indicates a highly inaccurate power rating, the system technician (101) may then modify the estimated power ratings (114) within the profile, by measuring again, power consumption of configurations for which power consumption was previously measured, by measuring power consumption of new configurations for which power consumption was not previously measured, and in other ways as will occur to readers of skill in the art.

Exemplary embodiments of the present invention are described largely in the context of a fully functional computer system for establishing a power profile of power consuming components of computer system configurations for generating electrical ratings. Readers of skill in the art will recognize, however, that the present invention also may be embodied in a computer program product disposed on signal bearing media for use with any suitable data processing system. Such signal bearing media may be transmission media or recordable media for machine-readable information, including magnetic media, optical media, or other suitable media. Examples of recordable media include magnetic disks in hard drives or diskettes, compact disks for optical drives, magnetic tape, and others as will occur to those of skill in the art. Examples of transmission media include telephone networks for voice communications and digital data communications networks such as, for example, Ethernets™ and networks that communicate with the Internet Protocol and the World Wide Web as well as wireless transmission media such as, for example, networks implemented according to the IEEE 802.11 family of specifications. Persons skilled in the art will immediately recognize that any computer system having suitable programming means will be capable of executing the steps of the method of the invention as embodied in a program product. Persons skilled in the art will recognize immediately that, although some of the exemplary embodiments described in this specification are oriented to software installed and executing on computer hardware, nevertheless, alternative embodiments implemented as firmware or as hardware are well within the scope of the present invention.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of establishing a power profile of power consuming components of computer system configurations for generating electrical ratings, the method comprising:

beginning with a default, limited configuration of a computer system and continuing for a plurality of configurations of the computer system, each configuration including additional power consuming components not included in a previous configuration:

measuring, by a power profiling module for a present configuration, power consumption of the computer system;

calculating, by the power profiling module in dependence upon the measured power consumption for the present configuration, an estimated power rating for the one or more additional power consuming components not included in the previous configuration; and recording, by the power profiling module in a power profile, estimated power ratings for the one or more additional power consuming components not included in the previous configuration, wherein the number of configurations of the computer system for which power consumption is measured is less than the number of possible configurations of the computer system and wherein the power profiling module comprising one or more module of automated computing machinery.

2. The method of claim 1 further comprising generating, by a system configuration tool in dependence upon the power profile, electrical ratings for one or more computer systems, including:

receiving, from a user, system configuration parameters defining a configuration of a computer system, the system configuration parameters specifying one or more power consuming components of the computer system;

summing, in dependence upon the power profile of power consuming components, estimated power ratings of the power consuming components of the computer system configured in accordance with the system configuration parameters; and providing, to the user as the electrical rating for the computer system configured in accordance with the system configuration parameters, the sum of estimated power ratings of the power consuming components.

3. The method of claim 2 wherein receiving system configuration parameters defining a configuration of a computer system further comprises:

receiving the system configuration parameters through a graphical user interface ('GUI') provided to the user by the system configuration tool.

4. The method of claim 2 wherein receiving system configuration parameters defining a configuration of a computer system further comprises:

receiving the system configuration parameters in a configuration file.

5. The method of claim 1 wherein measuring power consumption of the computer system for a present configuration further comprises:

measuring the power consumption when the computer system is idle.

6. The method of claim 1 wherein measuring power consumption of the computer system for the present configuration further comprises:

measuring the power consumption when the computer system is executing a maximum load.

7. The method of claim 1 further comprising:

measuring, by the power profiling module for a number of predefined configurations of the computer system, power consumption of the computer system, each predefined configuration comprising one or more power consuming components;

summing, by the power profiling module for each of the predefined configurations, estimated power ratings of the power consuming components of the predefined configuration; and comparing, by the power profiling module, each sum of estimated power ratings to the measured power consumptions of the predefined configurations.

* * * * *